United States Patent
Chiu

(10) Patent No.: US 8,432,725 B2
(45) Date of Patent: Apr. 30, 2013

(54) STATIC RANDOM ACCESS MEMORY STRUCTURE AND CONTROL METHOD THEREOF

(75) Inventor: Chun-Yu Chiu, Tainan (TW)

(73) Assignee: Himax Technologies Limited, Tainan (TW)

( * ) Notice: Subject to any disclaimer, the term of this patent is extended or adjusted under 35 U.S.C. 154(b) by 9 days.

(21) Appl. No.: 13/190,031

(22) Filed: Jul. 25, 2011

(65) Prior Publication Data

US 2013/0028006 A1 Jan. 31, 2013

(51) Int. Cl.
*G11C 8/08* (2006.01)

(52) U.S. Cl.
USPC ...................................... 365/154; 365/230.06

(58) Field of Classification Search .................. 365/154, 365/189.07, 189.09, 190, 203, 230.06
See application file for complete search history.

(56) References Cited

U.S. PATENT DOCUMENTS

| 6,738,282 B2* | 5/2004 | Jo ................................. 365/149 |
| 2003/0185061 A1* | 10/2003 | Kato et al. ..................... 365/194 |
| 2009/0141565 A1* | 6/2009 | Koike ..................... 365/189.011 |

* cited by examiner

*Primary Examiner* — Douglas King
(74) *Attorney, Agent, or Firm* — McClure, Qualey & Rodack, LLP

(57) ABSTRACT

A static random access memory (SRAM) is provided. The SRAM structure includes an SRAM array, a word line decoder, and a reference bit line device. The SRAM array comprises at least one SRAM bit cell made up of six transistors. The word line decoder is used for decoding a word line of the SRAM bit cell array such that the word line is activated at a starting time and is deactivated at a ending time. The reference bit line device is connected between the SRAM array and the word line decoder and is used for pre-deactivating the word line at a predetermined time before the ending time such that a voltage difference between a bit line and a bit line bar of the SRAM bit cell is equal to a predetermined voltage.

11 Claims, 4 Drawing Sheets

STATIC RANDOM ACCESS MEMORY STRUCTURE AND CONTROL METHOD THEREOF

BACKGROUND OF THE INVENTION

1. Field of the Invention

The present disclosure relates to a static random access memory (SRAM).

2. Description of the Related Art

The structure of a conventional static random access memory bit cell 100 and the signal waveforms thereof are shown in FIG. 1B and 1A. When the word line (WL) is activated, the voltage difference between the bit line (BL) and the bit line bar (BLB) increasingly become larger, i.e. so called full swing voltage. As well known, there is a sense amplifier in the SRAM structure sensing the voltage difference. Generally, the minimum sensed voltage of the sense amplifier is about 200 mV. The full swing voltage is much larger than the minimum sensed voltage. Actually, large voltage differences do not make the SRAM more efficient, instead, it consumes much more power.

In order to overcome the drawback of consuming extra power, an SRAM structure and an operating method thereof for controlling the voltage difference to be close to the minimum sensed voltage is called for.

BRIEF SUMMARY OF INVENTION

A detailed description is given in the following embodiments with reference to the accompanying drawings.

In one embodiment, the invention provides a static random access memory (SRAM) structure. The SRAM structure includes an SRAM array, a word line decoder, and a reference bit line device. The SRAM array comprises at least one SRAM bit cell made up of six transistors. The word line decoder is used for decoding a word line of the SRAM bit cell array such that the word line is activated at a starting time and is deactivated at an ending time. The reference bit line device is connected between the SRAM array and the word line decoder and is used for pre-deactivating the word line at a predetermined time before the ending time such that a voltage difference between a bit line and a bit line bar of the SRAM bit cell is within a predetermined voltage.

In one embodiment, the invention provides a method for operating a static random access memory structure. The method comprises: decoding a word line by a word line decoder such that the word line is activated at a starting time and is deactivated at a ending time; generating a control signal according to a power supply voltage of the SRAM and a reference voltage value by a compare module; driving a reference bit line according to the control signal and the word line by a control module; and pre-deactivating the word line at a predetermined time before the ending time according to the reference bit line such that a voltage difference between a bit line and a bit line bar of the SRAM bit cell is within a predetermined voltage.

The SRAM structure and the operating method thereof accurately control the voltage difference between a bit line and a bit line bar to be close to a minimum sensed voltage by controlling the cut-off timing of a word line such that power consumption of the SRAM can be greatly reduced.

BRIEF DESCRIPTION OF DRAWINGS

The present invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figures 1A, 1B:
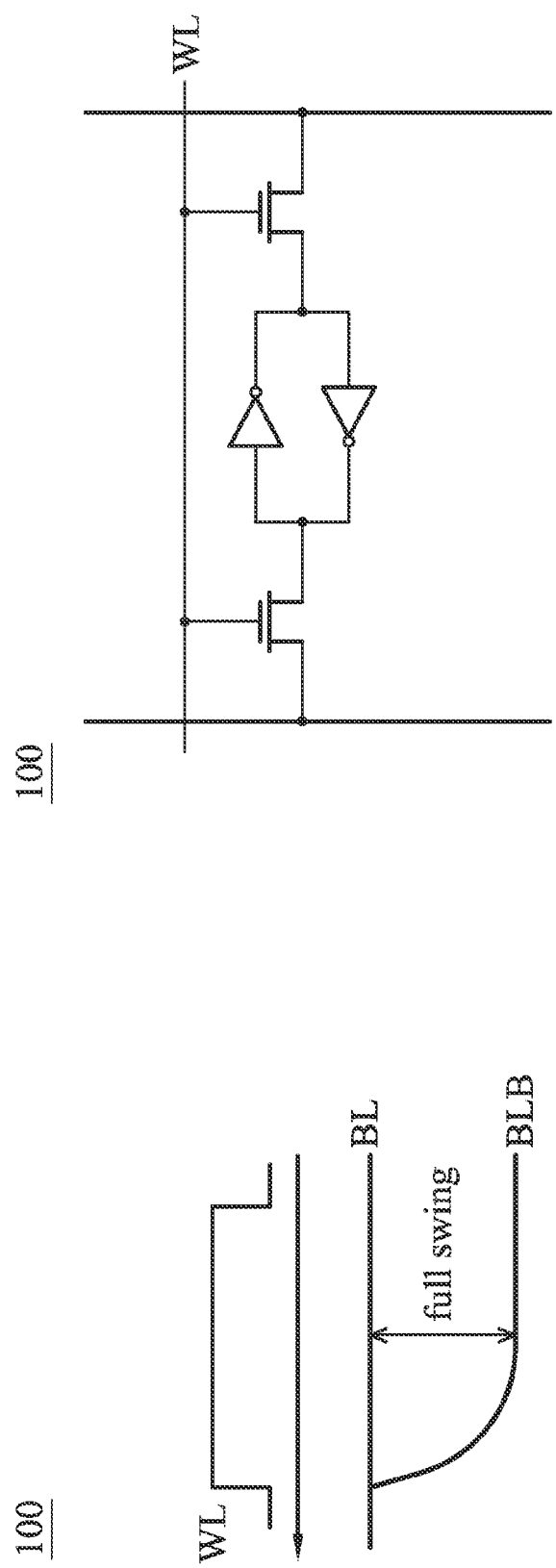
FIG. 1B and FIG. 1A show the structure of a conventional static random access memory bit cell and the signal waveforms thereof, respectively.
Figure 2B:
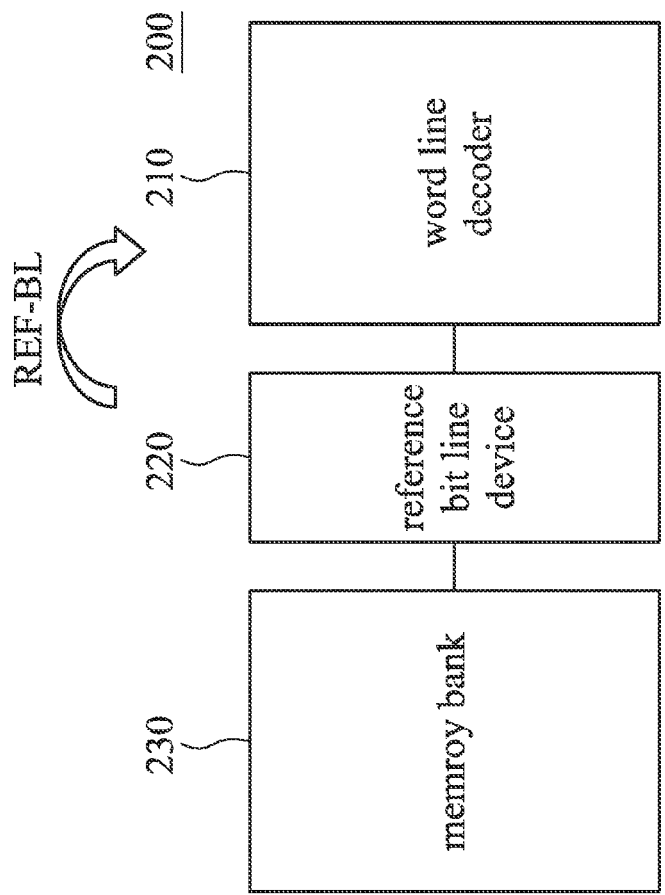
FIG. 2B and FIG. 2A show an SRAM structure of an embodiment according to the present invention and the signal waveforms thereof, respectively.
Figure 2A:
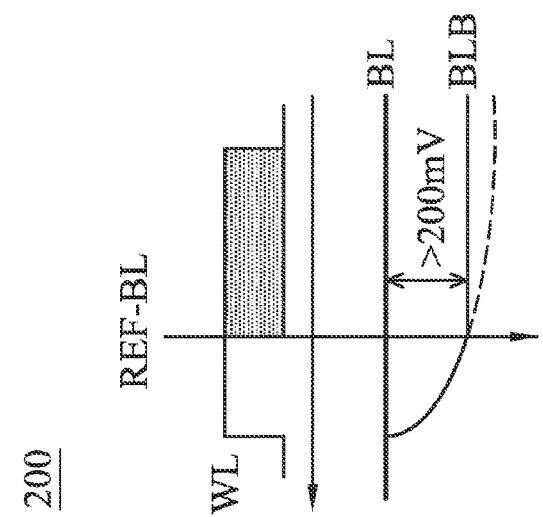

FIG. 2B and 2A show an SRAM structure of the embodiment and the signal waveforms thereof. The SRAM 200 includes a word line decoder 210, a reference bit line device 220, and a memory bank 230. The memory bank 230 includes a plurality of SRAM arrays having at least one SRAM bit cell. The structure of the SRAM bit cell is shown in FIG. 1. The word line decoder 210 is used to decode a word line of the SRAM bit cell array such that the word line is activated at a starting time and is deactivated at an ending time. The reference bit line device 220 is connected between the memory bank 230 and the word line decoder 210. The reference bit line device 220 is used to pre-deactivate the word line at a predetermined time before the ending time such that a voltage difference between a bit line and a bit line bar of the SRAM bit cell is equal to a predetermined voltage. The predetermined voltage is larger than a minimum sensing voltage of a sense amplifier and is smaller than a full swing voltage between the bit lines and the bit lines bar. In other words, the reference bit line device 220 is used to deactivate the word lines when the voltage difference between the bit lines and the bit lines bar are between the minimum sensed voltage and the full swing voltage after the time which the voltage difference approaching the minimum sensed voltage and before the ending time. The minimum sensed voltage is about 200 mV. Hence, a preferred predetermined voltage is 200 mV in order to save power.

Figure 3:
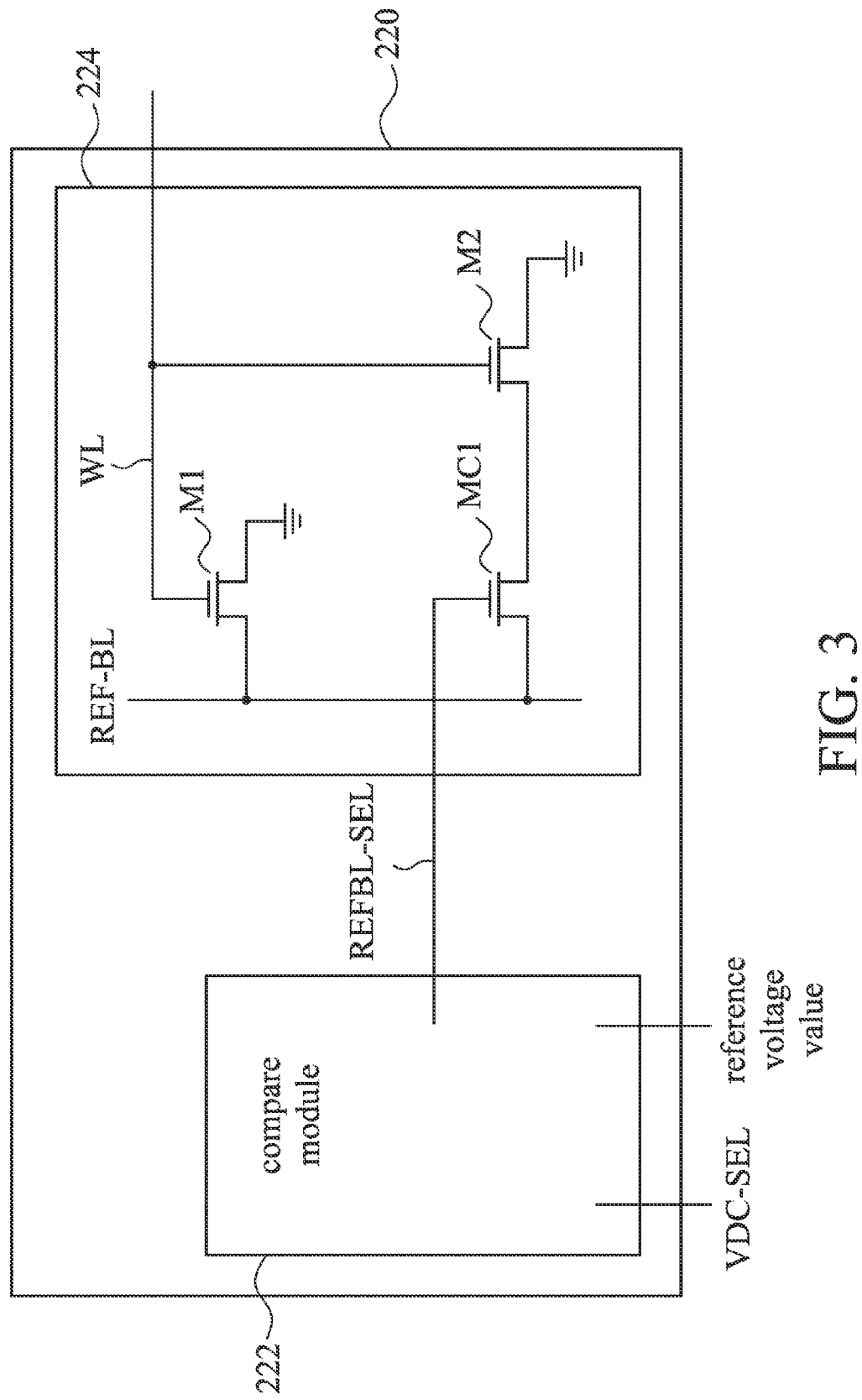
FIG. 3 is a diagram showing a compare module and a control module of the SRAM structure of the invention.

FIG. 3 is a diagram showing a compare module and a control module of the SRAM structure of the invention. The reference bit line device 220 includes a compare module 222 and a control module 224. The compare module 222 is used to generate a control signal (REFBL_SEL) according to the power supply voltage (VDC_SEL) of the SRAM and a reference voltage value. The control module 224 is used to control a reference bit line (REF_BL) according to the control signal (REFBL_SEL) and the word line (WT). It is noted that the driving capacity of the reference bit line (REF_BL) is enhanced according to the control signal (REFBL_SEL) and the word line (WT) when the power supply voltage of the SRAM is smaller than the reference voltage value such that the word line (WL) is deactivated before the predetermined time.

The driving capacity of the reference bit line (REF_BL) is reduced according to the control signal (REFBL_SEL) and the word line (WL) when the power supply voltage of the SRAM is larger than the reference voltage value such that the word line (WL) is deactivated after the predetermined time.

The reference bit line device includes at least a first switch M1, a second switch M2 and a control transistor MC1. The first switch M1 is connected between a ground and the reference bit line (REF_BL), the second switch M2 and the first control transistor MC1 are connected in series disposed between the ground and the reference bit line, the gates of the first switch M1 and the second switch M2 are connected to the word line, and the gate of the control transistor MC1 is connected to the control signal.

For example, when the power supply voltage is smaller than the reference voltage value, the control signal (REFBL-SEL) with high logic level is generated. The control signal (REFBL-SEL) turns on the first control transistor MC1 such that the reference bit line (REF_BL) is further pulled down by the ground through the first control transistor MC1 and the second switch M2. Hence, the driving capacity of the reference bit line (REF_BL) is enhanced.

When the power supply voltage is larger than the reference voltage value, a control signal (REFBL_SEL) with low logic level is generated such that the first control transistor MC1 is tuned off Hence, the driving capacity of the reference bit line (REF_BL) is lowered.

Figure 4:
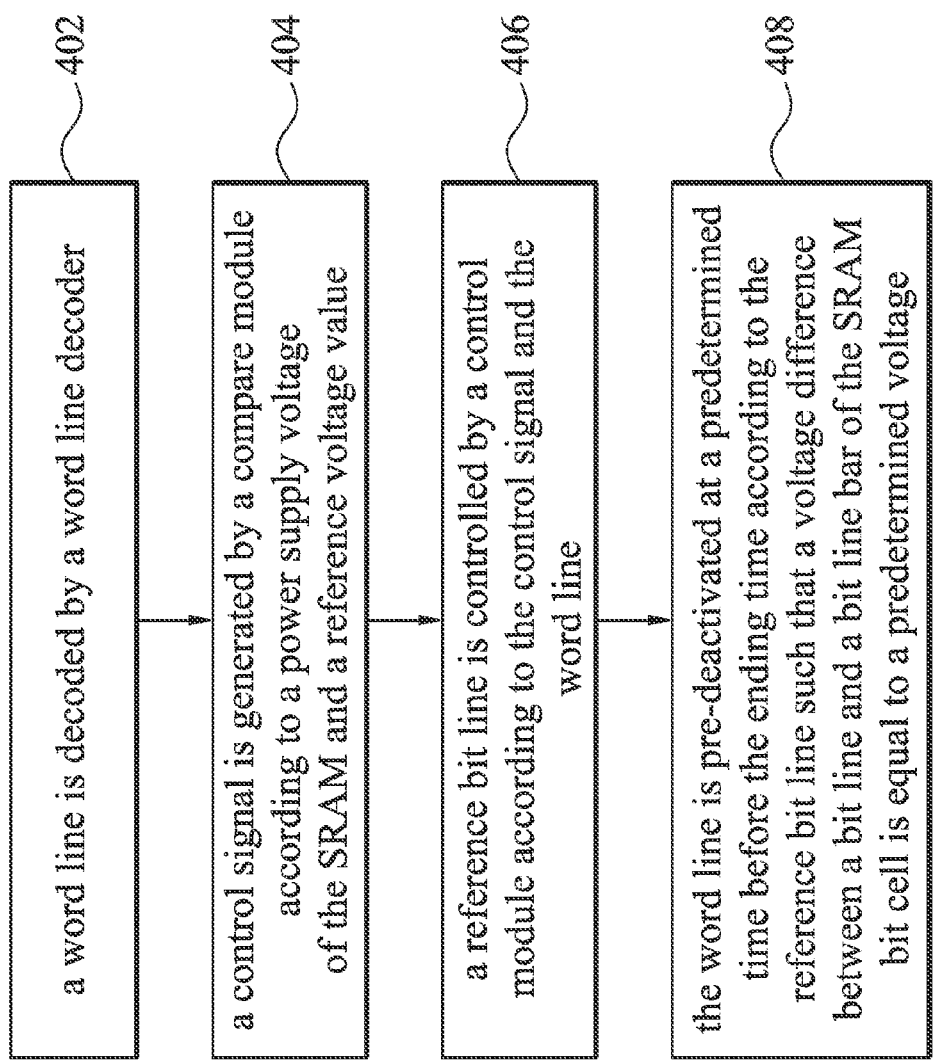
FIG. 4 is a flowchart illustrating the operating method of the SRAM structure of the invention.

FIG. 4 is a flowchart illustrating the operating method of the SRAM structure of the invention. At step 402, a word line is decoded by a word line decoder such that the word line is activated at a starting time and is deactivated at an ending time. Next, a control signal is generated by a compare module according to a power supply voltage of the SRAM and a reference voltage value in step 404. The control signal is used to control the first control transistor of the control module in the SRAM structure. Next, a reference bit line is controlled by a control module according to the control signal and the word line in step 406. The driving capacity of the reference bit line is enhanced according to the control signal when the power supply voltage of the SRAM is smaller than the reference voltage value because the first control transistor can be turned on by the control signal such that the reference bit line is further pulled down by the ground through the first control transistor and the second switch.

Finally, in step 408, the word line is pre-deactivated at a predetermined time before the ending time according to the reference bit line such that a voltage difference between a bit line and a bit line bar of the SRAM bit cell is equal to a predetermined voltage. The driving capacity of the reference bit line is enhanced according to the control signal when the power supply voltage of the SRAM is smaller than the reference voltage value such that the word line is deactivated before the predetermined time. The driving capacity of the reference bit line is reduced according to the control signal and the word line when the power supply voltage of the SRAM is larger than the reference voltage value such that the word line is deactivated after the predetermined time.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A static random access memory (SRAM) structure, comprising:
    an SRAM array, comprising at least one SRAM bit cell made up of six transistors;
    a word line decoder, for decoding a word line of the SRAM bit cell array to make the word line activated at a starting time of a reading operation and deactivated at a ending time of the reading operation; and
    a reference bit line device, connected between the SRAM array and the word line decoder, for pre-deactivating the word line at a predetermined time before the ending time of the reading operation and after the starting time of the reading operation such that a voltage difference between a bit line and a bit line bar of the SRAM bit cell is equal to a predetermined voltage.

2. The static random access memory structure as claimed in claim 1, wherein the predetermined voltage is larger than a minimum sensed voltage of a sense amplifier and is smaller than a full swing voltage between the bit line and the bit line bar.

3. The static random access memory structure as claimed in claim 2, wherein the reference bit line device further comprises:
    a compare module for generating at least one control signal according to the power supply voltage of the SRAM and a reference voltage value; and
    a control module for controlling a reference bit line according to the control signal and the word line.

4. The static random access memory structure as claimed in claim 3, wherein the driving capacity of the reference bit line is enhanced according to the control signal and the word line when the power supply voltage of the SRAM is smaller than the reference voltage value, whereby deactivating the word line before the predetermined time.

5. The static random access memory structure as claimed in claim 4, wherein the driving capacity of the reference bit line is reduced according to the control signal and the word line when the power supply voltage of the SRAM is larger than the reference voltage value such that the word line is deactivated after the predetermined time.

6. The static random access memory structure as claimed in claim 5, wherein the control module comprises:
    at least one first switch, one second switch and one first control transistor.

7. The static random access memory structure as claimed in claim 6, wherein the first switch is connected between a ground and the reference bit line, the second switch and the first control transistor are connected in series disposed between the ground and the reference bit line, the gates of the first switch and the second switch are connected to the word line, and the gate of the control transistor is connected to the control signal.

8. A method for operating a static random access memory structure, comprising:
    decoding a word line by a word line decoder to make the word line-activated at a starting time of a reading operation and deactivated at a ending time of the reading operation;
    generating a control signal according to a power supply voltage of the SRAM and a reference voltage value by a compare module;
    driving a reference bit line according to the control signal and the word line by a control module; and
    pre-deactivating the word line at a predetermined time before the ending time of the reading operation according to the reference bit line such that a voltage difference between a bit line and a bit line bar of the SRAM bit cell is equal to a predetermined voltage.

9. The method for operating a static random access memory as claimed in claim 8, wherein the predetermined voltage is larger than a minimum sensed voltage of a sense amplifier and is smaller than a full swing voltage between the bit line and the bit line bar.

10. The method for operating a static random access memory as claimed in claim 9, wherein the driving capacity of the reference bit line is enhanced according to the control signal and the word line when the power supply voltage of the SRAM is smaller than the reference voltage value, whereby deactivating the word line before the predetermined time.

11. The method for operating a static random access memory as claimed in claim 9, wherein the driving capacity of the reference bit line is reduced according to the control signal and the word line when the power supply voltage of the SRAM is larger than the reference voltage value such that the word line is deactivated after the predetermined time.

* * * * *